US012651589B2

(12) United States Patent (10) Patent No.: US 12,651,589 B2
Zeng (45) Date of Patent: Jun. 9, 2026

(54) SELF-ADAPTIVE ADJUSTMENT METHOD OF ANC PARAMETER, DEVICE AND STORAGE MEDIUM

(71) Applicant: GOERTEK INC., Weifang (CN)

(72) Inventor: Kai Zeng, Weifang (CN)

(73) Assignee: GOERTEK INC., Weifang (CN)

( * ) Notice: Subject to any disclaimer, the term of this patent is extended or adjusted under 35 U.S.C. 154(b) by 173 days.

(21) Appl. No.: 18/769,541

(22) Filed: Jul. 11, 2024

(65) Prior Publication Data

US 2024/0363093 A1 Oct. 31, 2024

Related U.S. Application Data

(63) Continuation of application No. PCT/CN2022/084596, filed on Mar. 31, 2022.

(30) Foreign Application Priority Data

Feb. 24, 2022 (CN) .......................... 202210174777.4

(51) Int. Cl.
 *G10K 11/178* (2006.01)
 *H03G 3/30* (2006.01)
(52) U.S. Cl.
 CPC ....... *G10K 11/1785* (2018.01); *H03G 3/3089* (2013.01); *G10K 2210/3213* (2013.01)
(58) Field of Classification Search
 CPC .. H04R 1/1083; H04R 2460/01; H04R 29/00; H04R 1/22; H03G 3/3089; G10K 11/1785; G10K 2210/3213
 USPC .............................. 381/370, 56, 57, 71.1, 74
 See application file for complete search history.

(56) References Cited

U.S. PATENT DOCUMENTS

2018/0192191 A1 7/2018 Termeulen et al.

FOREIGN PATENT DOCUMENTS

| CN | 108764073 | A | 11/2018 |
| CN | 109686378 | A | 4/2019 |
| CN | 110049403 | A | 7/2019 |
| CN | 110996215 | A | 4/2020 |
| CN | 112911446 | A | 6/2021 |
| CN | 113645532 | * | 11/2021 |
| CN | 113645532 | A | 11/2021 |
| CN | 113766384 | A | 12/2021 |
| WO | 2021104957 | A1 | 6/2021 |

OTHER PUBLICATIONS

Grant Notification in Corresponding Chinese Application No. 202210174777.4, dated Oct. 26, 2022; 5 pgs.
International Search Report and Written Opinion in International Application No. PCT/CN2022/084596, mailed Nov. 24, 2022; 11 pgs.

* cited by examiner

*Primary Examiner* — Norman Yu
(74) *Attorney, Agent, or Firm* — HAUPTMAN HAM, LLP

(57) ABSTRACT

Disclosed are a self-adaptive adjustment method of active noise cancellation (ANC) parameter, a device and a computer-readable storage medium. The method includes: obtaining frequency points of noise reduction headphone with energy loss and energy loss values of each frequency point, and determining a quantity of the frequency points with the energy loss values are greater than a first energy loss threshold; determining whether a sum of the energy loss values is greater than a second energy loss threshold, and determining whether the quantity of frequency points is greater than a preset frequency point quantity threshold.

10 Claims, 2 Drawing Sheets

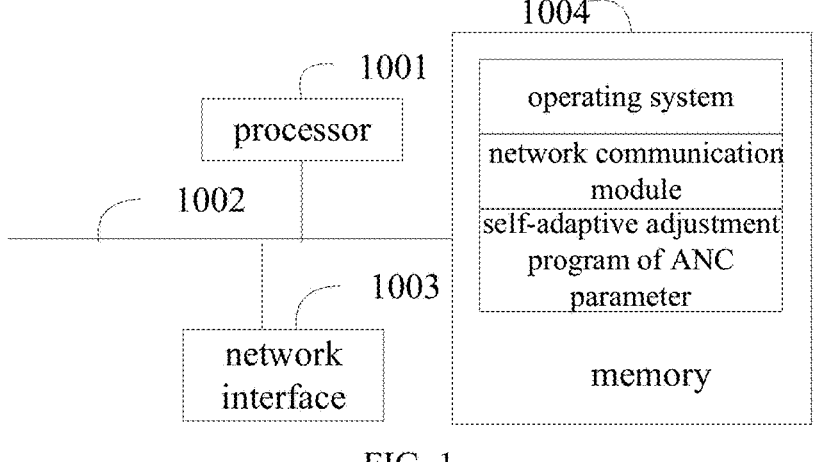

FIG. 1

S10 obtaining frequency points of noise reduction headphone with energy loss and energy loss values of each frequency point, and determining a quantity of the frequency points with the energy loss values are greater than a first energy loss threshold

S20 determining whether a sum of the energy loss values is greater than a second energy loss threshold, and determining whether the quantity of frequency points is greater than a preset frequency point quantity threshold

S30 in response to that the sum of the energy loss values is greater than a second energy loss threshold and the quantity of frequency points is greater than the preset frequency point quantity threshold, calculating a main frequency of a chip of the noise reduction headphone and adjusting the chip to a target main frequency mode corresponding to the main frequency; and calculating and adjusting the ANC parameter of the noise reduction headphone in the target main frequency mode

FIG. 2

SELF-ADAPTIVE ADJUSTMENT METHOD OF ANC PARAMETER, DEVICE AND STORAGE MEDIUM

CROSS-REFERENCE TO RELATED APPLICATIONS

This application is a continuation application of International Application No. PCT/CN2022/084596, filed on Mar. 31, 2022, which claims priority to Chinese Patent Application No. 202210174777.4, filed on Feb. 24, 2022, and titled "SELF-ADAPTIVE ADJUSTMENT METHOD OF ANC PARAMETER, DEVICE, AND STORAGE MEDIUM". The disclosures of the above-mentioned applications are incorporated herein by reference in their entireties.

TECHNICAL FIELD

The present application relates to the technical field of ANC active noise reduction, and in particular to a self-adaptive adjustment method of active noise cancellation (ANC) parameter, a device, and a computer-readable storage medium.

BACKGROUND

When wearing semi-in-ear headphones, the seal to the ear canal is poor, and the difference in wearing tightness of users will also affect the noise reduction effect. Therefore, it is difficult to achieve the ideal noise reduction effect with fixed active noise cancellation (ANC) parameters. At present, when adjusting the ANC parameters, it is often necessary to recalculate all filter parameters according to the wearing situation, which requires high processing power and computing resources of the chip, and the power consumption of this process is also high. There are also some methods that preset multiple noise reduction curves and select one of them according to the wearing situation, but this method requires a lot of preliminary testing and verification work, and it consumes more storage resources to store the preset filters. At the same time, because the parameters are not calculated in real time, it is difficult to accurately match complex actual usage scenarios.

The above content is only used to assist in understanding the technical solutions of the present application, and does not represent an admission that the above content is prior art.

SUMMARY

The main objective of the present application is to provide a self-adaptive adjustment method of active noise cancellation (ANC) parameter, aiming to solve the technical problem that the ANC parameter adjustment in the related art cannot achieve an ideal noise reduction effect when facing different usage scenarios.

In order to achieve the above objective, the present application provides a self-adaptive adjustment method of ANC parameter, including:

obtaining frequency points of noise reduction headphone with energy loss and energy loss values of each frequency point, and determining a quantity of the frequency points with the energy loss values are greater than a first energy loss threshold;

determining whether a sum of the energy loss values is greater than a second energy loss threshold, and determining whether the quantity of frequency points is greater than a preset frequency point quantity threshold;

in response to that the sum of the energy loss values is greater than a second energy loss threshold and the quantity of frequency points is greater than the preset frequency point quantity threshold, calculating a main frequency of a chip of the noise reduction headphone and adjusting the chip to a target main frequency mode corresponding to the main frequency; and calculating and adjusting the ANC parameter of the noise reduction headphone in the target main frequency mode.

In an embodiment, the noise reduction headphone includes at least: a speaker, a feedback microphone and a feedforward microphone, and before the obtaining the frequency points of noise reduction headphone with energy loss and the energy loss values of each frequency point, the method further includes:

in response to detecting a fit of the noise reduction headphone, playing a test audio through the speaker and receiving the test audio by the feedback microphone to obtain a received audio.

In an embodiment, the obtaining the frequency points of noise reduction headphone with energy loss and the energy loss values of each frequency point includes:

calculating the frequency points of the noise reduction headphone with energy loss and the energy loss values of each frequency point based on energy in the test audio and the received audio.

In an embodiment, after the determining whether the sum of the energy loss values is greater than the second energy loss threshold, and determining whether the quantity of frequency points is greater than the preset frequency point quantity threshold, the method further includes:

in response to that the sum of the energy loss values is not greater than the second energy loss threshold, and the quantity of frequency points is not greater than the preset frequency point quantity threshold, adjusting a gain of the feedforward microphone.

In an embodiment, the calculating the main frequency of the chip of the noise reduction headphone includes:

calculating the main frequency according to the quantity of frequency points and a preset theoretical processing time.

In an embodiment, the chip includes a plurality of main frequency modes, and the adjusting the chip to the target main frequency mode corresponding to the main frequency includes:

obtaining a main frequency range of each main frequency mode, determining the target main frequency mode according to the main frequency range in which the main frequency is located, and adjusting the chip to a corresponding target main frequency mode.

In an embodiment, after the calculating and adjusting the ANC parameter of the noise reduction headphone in the target main frequency mode, the method further includes:

restoring the target main frequency mode to the main frequency mode of the chip before the ANC parameter is adjusted.

In an embodiment, before the obtaining the frequency points of noise reduction headphone with energy loss and the energy loss values of each frequency point, the method further includes:

calculating the first energy loss threshold, the preset frequency point quantity threshold, the second energy loss threshold and the preset theoretical processing time based on the current ANC parameters of the noise reduction headphone.

In addition, in order to achieve the above objective, the present application further provides a self-adaptive adjustment device of ANC parameter, including: a memory, a processor, and a self-adaptive adjustment program of ANC parameter stored on the memory and executable on the processor, when the self-adaptive adjustment program of ANC parameter is executed by the processor, the above self-adaptive adjustment method of ANC parameter is implemented.

In addition, in order to achieve the above objective, the present application further provides a computer-readable storage medium. The computer-readable storage medium stores a self-adaptive adjustment program of ANC parameter. When the self-adaptive adjustment program of ANC parameter is executed by a processor, the above self-adaptive adjustment method of ANC parameter is implemented.

The embodiments of the present application provide the self-adaptive adjustment method of ANC parameter, the device, and the computer-readable storage medium. The method includes: obtaining frequency points of noise reduction headphone with energy loss and energy loss values of each frequency point, and determining a quantity of the frequency points with the energy loss values are greater than a first energy loss threshold; determining whether a sum of the energy loss values is greater than a second energy loss threshold, and determining whether the quantity of frequency points is greater than a preset frequency point quantity threshold; in response to that the sum of the energy loss values is greater than a second energy loss threshold and the quantity of frequency points is greater than the preset frequency point quantity threshold, calculating a main frequency of a chip of the noise reduction headphone and adjusting the chip to a target main frequency mode corresponding to the main frequency; and calculating and adjusting the ANC parameter of the noise reduction headphone in the target main frequency mode.

When testing the fit of headphones, the test audio is played by the speaker and then then received by the feedback microphone to calculate the energy loss value of the frequency point corresponding to the current ANC parameter. According the energy loss value, it is determined whether to adjust by the gain of the feedforward microphone, that is, to achieve rapid adjustment by raising the overall noise reduction curve, or to adjust by recalculating the filter parameters. According to the way the ANC parameters are adjusted, it is further determined whether the CPU main frequency needs to be increased to speed up processing.

The present application uses this strategy of dynamic adjustment according to the energy loss value to allow users to obtain ideal noise reduction effects in different usage scenarios, and can also optimize parameter calculations in different scenarios to achieve the purpose of reducing power consumption. In this way, while ensuring noise reduction performance, it can also reduce power consumption, meet complex user usage scenarios, and enable users to obtain a more ideal noise reduction effect. And since the ANC parameters are dynamically adjusted during the headphone fit test in the wearing process, the effect of improving the user experience without feeling is also achieved.

BRIEF DESCRIPTION OF THE DRAWINGS

FIG. 1 is a schematic diagram of the terminal structure of the hardware operating environment according to an embodiment of the present application.

FIG. 2 is a schematic flowchart of a self-adaptive adjustment method of active noise cancellation (ANC) parameter according to an embodiment of the present application.

Figure 3:
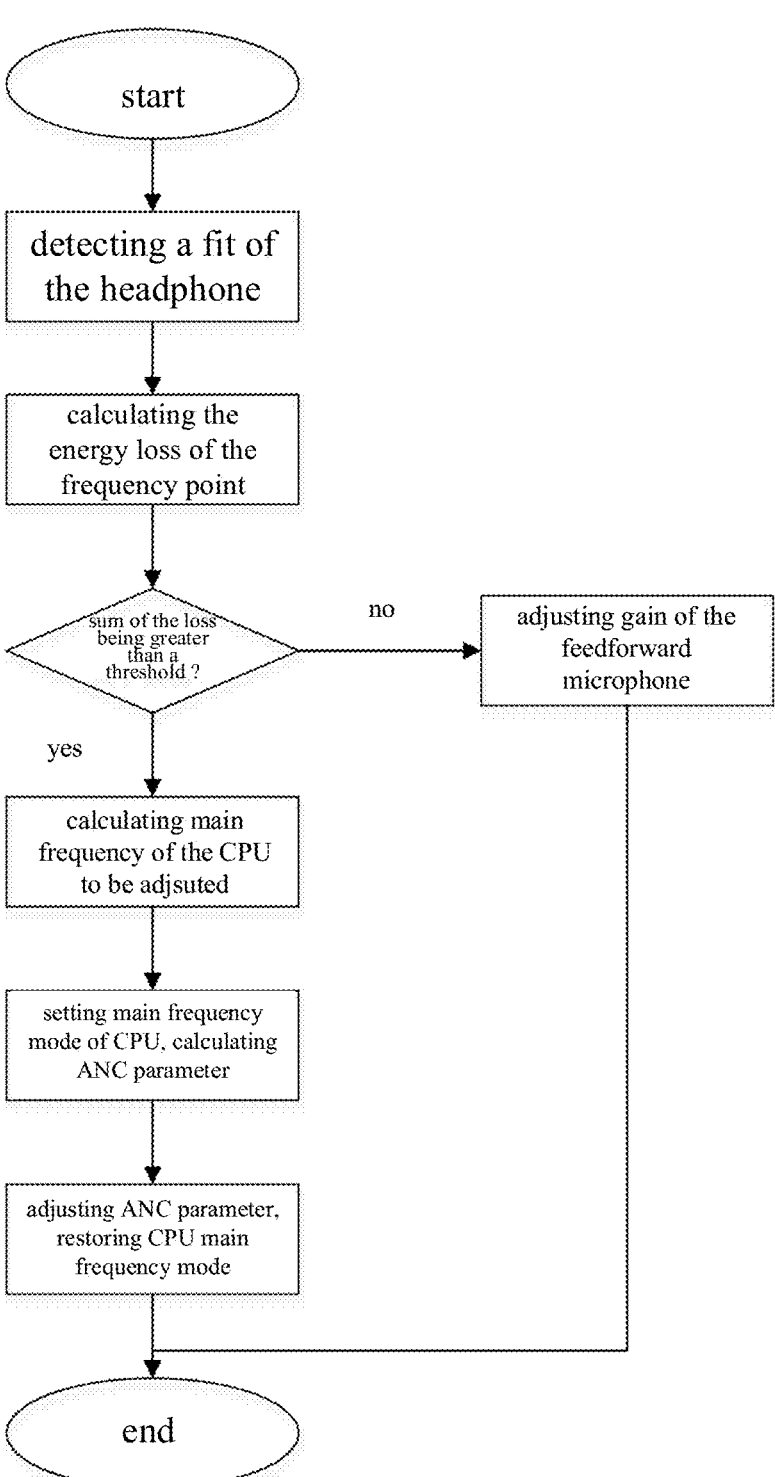
FIG. 3 is a schematic diagram of an application flow of the self-adaptive adjustment method of ANC parameter according to an embodiment of the present application.

The realization of the purpose, functional features and advantages of the present application will be further described with reference to the embodiments and the accompanying drawings.

DETAILED DESCRIPTION OF THE EMBODIMENTS

It should be understood that the specific embodiments described herein are only used to explain the present application and are not used to limit the present application.

As shown in FIG. 1, FIG. 1 is a schematic diagram of the terminal structure of the hardware operating environment according to an embodiment of the present application.

As shown in FIG. 1, the terminal device may include: a processor 1001, such as a central processing unit (CPU), a communication bus 1002, a network interface 1003, and a memory 1004. The communication bus 1002 is configured to realize connection communication between these components. The network interface 1003 may include a standard wired interface or a wireless interface (such as a wireless fidelity (Wi-Fi) interface). The memory 1004 may be a high-speed random-access memory (RAM) or a stable memory (non-volatile memory (NVM)), such as a disk memory. The memory 1004 may be a storage apparatus independent of the aforementioned processor 1001.

Those skilled in the art can understand that the terminal structure shown in FIG. 1 does not limit the terminal device, and may include more or fewer components than shown, or combine certain components, or include different components arrangement.

As shown in FIG. 1, memory 1004, which is a computer storage medium, may include an operating system, a network communication module, a user interface module and a self-adaptive adjustment program of active noise cancellation (ANC) parameter.

In the terminal shown in FIG. 1, the network interface 1003 is mainly configured to communicate with other devices; the processor 1001 and memory 1004 in the terminal device of the present application may be provided in the terminal device, and the terminal device may use the processor 1001 to call the self-adaptive adjustment program of ANC parameter stored in memory 1004 and perform the following operations:

obtaining frequency points of noise reduction headphone with energy loss and energy loss values of each frequency point, and determining a quantity of the frequency points with the energy loss values are greater than a first energy loss threshold;

determining whether a sum of the energy loss values is greater than a second energy loss threshold, and determining whether the quantity of frequency points is greater than a preset frequency point quantity threshold;

in response to that the sum of the energy loss values is greater than a second energy loss threshold and the quantity of frequency points is greater than the preset frequency point quantity threshold, calculating a main frequency of a chip of the noise reduction headphone and adjusting the chip to a target main frequency mode corresponding to the main frequency; and calculating and adjusting the ANC parameter of the noise reduction headphone in the target main frequency mode.

In an embodiment, the processor 1001 may call the self-adaptive adjustment program of ANC parameter stored in the memory 1004, and further perform the following operations.

The noise reduction headphone includes at least: a speaker, a feedback microphone and a feedforward microphone. The steps before the obtaining the frequency points of noise reduction headphone with energy loss and the energy loss values of each frequency point, the method further includes:

in response to detecting a fit of the noise reduction headphone, playing a test audio through the speaker and receiving the test audio by the feedback microphone to obtain a received audio.

In an embodiment, the processor 1001 may call the self-adaptive adjustment program of ANC parameter stored in the memory 1004, and further perform the following operations.

The step of the obtaining the frequency points of noise reduction headphone with energy loss and the energy loss values of each frequency point includes:

calculating the frequency points of the noise reduction headphone with energy loss and the energy loss values of each frequency point based on energy in the test audio and the received audio.

In an embodiment, the processor 1001 may call the self-adaptive adjustment program of ANC parameter stored in the memory 1004, and further perform the following operations.

After the determining whether the sum of the energy loss values is greater than the second energy loss threshold, and determining whether the quantity of frequency points is greater than the preset frequency point quantity threshold, the method further includes:

in response to that the sum of the energy loss values is not greater than the second energy loss threshold, and the quantity of frequency points is not greater than the preset frequency point quantity threshold, adjusting a gain of the feedforward microphone.

In an embodiment, the processor 1001 may call the self-adaptive adjustment program of ANC parameter stored in the memory 1004, and further perform the following operations.

The step of the calculating the main frequency of the chip of the noise reduction headphone includes:

calculating the main frequency according to the quantity of frequency points and a preset theoretical processing time.

In an embodiment, the processor 1001 may call the self-adaptive adjustment program of ANC parameter stored in the memory 1004, and further perform the following operations.

The chip includes a plurality of main frequency modes, and the step of adjusting the chip to the target main frequency mode corresponding to the main frequency includes:

obtaining a main frequency range of each main frequency mode, determining the target main frequency mode according to the main frequency range in which the main frequency is located, and adjusting the chip to a corresponding target main frequency mode.

In an embodiment, the processor 1001 may call the self-adaptive adjustment program of ANC parameter stored in the memory 1004, and further perform the following operations.

After the step of calculating and adjusting the ANC parameter of the noise reduction headphone in the target main frequency mode, the method further includes:

restoring the target main frequency mode to the main frequency mode of the chip before the ANC parameter is adjusted.

In an embodiment, the processor 1001 may call the self-adaptive adjustment program of ANC parameter stored in the memory 1004, and further perform the following operations.

Before the obtaining the frequency points of noise reduction headphone with energy loss and the energy loss values of each frequency point, the method further includes:

calculating the first energy loss threshold, the preset frequency point quantity threshold, the second energy loss threshold and the preset theoretical processing time based on the current ANC parameters of the noise reduction headphone.

An embodiment of the present application provides a self-adaptive adjustment method of ANC parameter. As shown in FIG. 2, FIG. 2 is a schematic flowchart of the self-adaptive adjustment method of ANC parameter according to a first embodiment of the present application.

In the embodiment, the self-adaptive adjustment method of ANC parameter includes:

step S10, obtaining frequency points of noise reduction headphone with energy loss and energy loss values of each frequency point, and determining a quantity of the frequency points with the energy loss values are greater than a first energy loss threshold.

The preset ANC parameters include different frequency points. The test audio is configured to lose energy at different frequency points. By receiving the energy between the audio and the test audio, the energy loss value of each frequency point is compared. If the energy loss value is greater than the first energy loss threshold $\theta i$, it is noted that the ANC parameters need to be adjusted at the frequency point, and the quantity of frequency points tn with energy loss values are greater than the first energy loss threshold $\theta i$ is recorded. The specific method is: while detecting the fit of the headphone, the energy loss value of different frequency points in the current wearing scenario is obtained. The test audio is broadcast through the speaker, received by the feedback microphone, and is then obtained. The preset ANC parameters include the frequency points f1, f2 . . . fn, the energy of the corresponding frequency points in the test audio is Ef1, Ef2 . . . Efn, and the energy of the corresponding frequency points in the audio signal received by the feedback microphone is Eb1, Eb2 . . . . Ebn, then the energy loss value of the corresponding frequency point is $\Delta E1 = |Ef1 - Eb1|$, $\Delta E2 = |Ef2 - Eb2|$ . . . $\Delta En = |Efn - Ebn|$. Then, the quantity tn of frequency points with energy loss values being greater than the first energy loss threshold $\theta i$ is selected from $\Delta E1$, $\Delta E2$ . . . $\Delta En$.

Step S20: determining whether a sum of the energy loss values is greater than a second energy loss threshold, and determining whether the quantity of frequency points is greater than a preset frequency point quantity threshold.

Similarly, when comparing the energy loss values of each frequency point, in addition to recording the quantity of frequency points tn with energy loss values being greater than the first energy loss threshold $\theta i$, the sum of all energy loss values Sum ($\Delta E$) is also recorded. It is determined whether the total energy loss value of all frequency points is greater than the second energy loss threshold $\theta sum$, and if the total energy loss value of all frequency points is greater than the second energy loss threshold $\theta sum$, it is then determined whether the quantity of frequency points tn is greater than the preset frequency point quantity threshold θtn.

Step S30: in response to that the sum of the energy loss values is greater than a second energy loss threshold and the quantity of frequency points is greater than the preset frequency point quantity threshold, calculating a main frequency of a chip of the noise reduction headphone and adjusting the chip to a target main frequency mode corresponding to the main frequency; and calculating and adjusting the ANC parameter of the noise reduction headphone in the target main frequency mode.

If the sum of the energy loss values is greater than the second energy loss threshold and the quantity of frequency points is greater than the preset frequency point quantity threshold, it means that the energy loss value is large in the current headphone wearing environment. By calculating the main frequency size df to be adjusted. The chip is adjusted to the target main frequency mode corresponding to the main frequency size df, and is overlocked. And then, the chip adjusts and calculates the ANC parameters in the target main frequency mode.

In the embodiment, the frequency points of the noise reduction headphones with energy loss and the energy loss values of each frequency point are obtained, and the quantity of frequency points with energy loss values being greater than a first energy loss threshold is determined. It is determined whether the sum of the energy loss values is greater than a second energy loss threshold, and whether the quantity of frequency points is greater than a preset frequency point quantity threshold; if the sum of the energy loss values is greater than the second energy loss threshold and the quantity of frequency points is greater than the preset frequency point quantity threshold, the main frequency of the chip of the noise reduction headphones is calculated and the chip is adjusted to a target main frequency mode corresponding to the main frequency. The ANC parameters of the noise reduction headphones are calculated and adjusted in the target main frequency mode.

In an embodiment, when performing the headphone fit test, the test audio is played by the speaker and then received by the feedback microphone to calculate the energy loss value of the frequency point corresponding to the current ANC parameter. According the energy loss value, it is determined whether to adjust by the gain of the feedforward microphone, that is, to achieve rapid adjustment by raising the overall noise reduction curve, or to adjust by recalculating the filter parameters. According to the way the ANC parameters are adjusted, it is further determined whether the CPU main frequency needs to be increased to speed up processing.

In an embodiment, the current ANC parameters are dynamically adjusted when performing a headphone fit test after detecting that the user has worn the noise reduction headphones. When the headphones are well-fitted or the user slightly adjusts the headphone fit, that is, when the energy loss value is small, the CPU main frequency is kept unchanged, and only the feedforward microphone gain is adjusted; when the headphones are poorly fitted, or the fit is loose. That is, when the energy loss value is large, the CPU main frequency is adjusted to the corresponding mode, and the adjusted ANC parameters are recalculated, and the CPU main frequency is restored after the calculation is completed. This strategy of dynamic adjustment according to the energy loss value can not only allow users to obtain ideal noise reduction effects in different usage scenarios, but also optimize parameter calculations in different scenarios to achieve the purpose of reducing power consumption. In this way, power consumption can be reduced while ensuring performance, satisfying complex user usage scenarios, and enabling users to obtain more ideal noise reduction effects. And since the ANC parameters are dynamically adjusted during the headphone fit test in the wearing process, the effect of improving the user experience without feeling is also achieved.

In an embodiment, the noise reduction headphone includes at least: a speaker, a feedback microphone and a feedforward microphone, and before the step of obtaining the frequency points of noise reduction headphone with energy loss and the energy loss values of the each frequency point, the method further includes:

in response to detecting a fit of the noise reduction headphone, playing a test audio through the speaker and receiving the test audio by the feedback microphone to obtain a received audio.

When detecting the fit of the headphone, a test audio is broadcast through the speaker, and the feedback microphone receives the test audio to obtain the received audio. The energy loss values at different frequencies in the current wearing scenario can be obtained through the test audio and the received audio. In an embodiment, the method for obtaining the energy loss value is not limited, and the time for obtaining the energy loss value is not limited to whether it is automatically obtained when detecting the fit of the headphone or when the user manually adjusts the noise reduction effect during normal wearing and use.

In an embodiment, the step of obtaining the frequency points of noise reduction headphone with energy loss and the energy loss values of the each frequency point includes:

calculating the frequency points of the noise reduction headphone with energy loss and the energy loss values of the each frequency point based on energy in the test audio and the received audio.

The specific method for obtaining the energy loss values of different frequency points in the current wearing scenario through the test audio and the received audio is as follows: the frequency points included in the preset ANC parameters are f1, f2 . . . fn, the energy of the corresponding frequency points in the test audio is Ef1, Ef2 . . . Efn, and the energy of the corresponding frequency points in the received audio signal received by the feedback microphone is Eb1, Eb2 . . . Ebn, then the energy loss value of the corresponding frequency point is $\Delta E1=|Ef1\text{-}Eb1|$, $\Delta E2=|Ef2\text{-}Eb2| . . .$ $\Delta En=|Efn\text{-}Ebn|$. In a simplest way, energy can be understood as sound volume, so the fit of the noise reduction headphones can be tested by the combination of speakers and microphones.

In an embodiment, after the step of determining whether the sum of the energy loss values is greater than the second energy loss threshold, and determining whether the quantity of frequency points is greater than the preset frequency point quantity threshold, the method further includes:

in response to that the sum of the energy loss values is not greater than the second energy loss threshold, and the quantity of frequency points is not greater than the preset frequency point quantity threshold, adjusting a gain of the feedforward microphone.

If the sum of the energy loss values of all frequency points Sum (ΔE) is not greater than the second energy loss threshold θsum and the quantity of frequency points tn is not greater than the preset frequency point quantity threshold θtn, it means that the energy loss value is small in the current headphone wearing environment. the self-adaptive adjustment method of ANC parameter is modified to adjust the feedforward microphone gain, that is, the noise reduction curve is overall raised.

In an embodiment, the step of calculating the main frequency of the chip of the noise reduction headphone includes:

calculating the main frequency according to the quantity of frequency points and a preset theoretical processing time.

If the energy loss value is large in the current headphone wearing environment, it is necessary to calculate the main frequency that needs to be adjusted, adjust the chip to the target main frequency mode corresponding to the main frequency, and calculate and adjust the ANC parameters in the target main frequency mode after overclocking. The main frequency size $df=tn/ts$ is calculated based on the quantity of frequency points and theoretical processing time, $df$ is the main frequency size, $tn$ is the quantity of frequency points, and $ts$ is the theoretical processing time.

In an embodiment, the chip includes a plurality of main frequency modes, and the step of adjusting the chip to the target main frequency mode corresponding to the main frequency includes:

obtaining a main frequency range of each main frequency mode, determining the target main frequency mode according to the main frequency range in which the main frequency is located, and adjusting the chip to a corresponding target main frequency mode.

Currently, the main frequency of many chips can be set to different modes, corresponding to different sizes, such as low power consumption mode corresponding to 32 kHz, normal mode corresponding to 80 kHz, and high performance mode corresponding to 120 kHz. After calculating the main frequency size, when adjusting the chip to the target main frequency mode corresponding to the main frequency size, it is adjusted to the target main frequency mode according to the main frequency range of the main frequency size. For example, if the main frequency size is calculated to be 40 kHz, the target main frequency mode of the chip is adjusted to the normal mode. If the main frequency size is calculated to be 100 kHz, the target main frequency mode of the chip is adjusted to the high-performance mode, and the main frequency of the target main frequency mode shall be the lowest to meet the calculated main frequency size.

In an embodiment, after the step of calculating and adjusting the ANC parameter of the noise reduction headphone in the target main frequency mode, the method further includes:

restoring the target main frequency mode to the main frequency mode of the chip before the ANC parameter is adjusted.

If the energy loss value is large in the current headphone wearing environment, after overclocking the chip and calculating and adjusting the ANC parameters in the target main frequency mode, that is, after the self-adaptive adjustment of ANC parameter is completed, it is necessary to restore the main frequency of the CPU to the original mode, thereby reducing power consumption and improving the experience.

In an embodiment, before the step of obtaining the frequency points of noise reduction headphone with energy loss and the energy loss values of the each frequency point, the method further includes:

calculating the first energy loss threshold, the preset frequency point quantity threshold, the second energy loss threshold and the preset theoretical processing time based on the current ANC parameters of the noise reduction headphone.

Before obtaining the energy loss values of the noise reduction headphones at different frequency points and dynamically adjusting the ANC parameters based on the energy loss values, it is also necessary to calculate or set the first energy loss threshold $\theta i$, the preset frequency point quantity threshold $\theta tn$, the second energy loss threshold $\theta sum$ and the theoretical processing time based on the product form and the current ANC parameters after simulation and a large quantity of test verifications. The theoretical processing time is determined by the chip processing capability and the preset ANC parameter type, and is obtained by pre-calculation.

An embodiment of the present application provides a self-adaptive adjustment method of ANC parameter. As shown in FIG. 3, FIG. 3 is a schematic diagram of an application flow of the self-adaptive adjustment method of ANC parameter according to an embodiment of the present application.

Step 1: detecting the fit of the headphones and obtaining the energy loss values at different frequencies in the current wearing scenario. In the embodiment, the test audio is broadcast through the speaker, received by the feedback microphone, and is then obtained. The specific method is: the preset ANC parameters include the frequency points $f1$, $f2 \ldots fn$, the energy of the corresponding frequency points in the test audio is $Ef1$, $Ef2 \ldots Efn$, and the energy of the corresponding frequency points in the audio signal received by the feedback microphone is $Eb1$, $Eb2 \ldots Ebn$, then the energy loss value of the corresponding frequency point is $\Delta E1=|Ef1-Eb1|$, $\Delta E2=|Ef2-Eb2| \ldots \Delta En=|Efn-Ebn|$.

Step 2: according to the energy loss value obtained in step 1, calculating respectively:

1) whether the sum of energy loss values Sum ($\Delta E$) is greater than the threshold $\theta$ sum?

2) whether the quantity of frequency points $tn$ that need to be adjusted is greater than the threshold $\theta tn$. The method for calculating the quantity of frequency points that need to be adjusted is: comparing the energy loss value of each frequency point, if $\Delta Ei$ is greater than the threshold $\theta i$, then the frequency point needs to adjust the parameters.

The thresholds $\theta sum$, $\theta tn$, and $\theta i$ are determined according to the product form and preset ANC parameters, and need to be verified through simulation and a large quantity of tests.

Step 3: in response to that conditions 1) and 2) in step 2 are not met, that is, the energy loss value is small, the self-adaptive ANC method is modifying the feedforward microphone gain, that is, raising the noise reduction curve as a whole.

Step 4: in response to that condition 1) in step 2 is met, further determining condition 2) and calculating the main frequency size $df=tn/ts$ that needs to be adjusted. $ts$ is the ideal processing time, which is determined by the chip processing capability and the preset ANC parameter type and is obtained by pre-calculation.

Step 5: according to the main frequency that needs to be adjusted in step 4, dynamically adjusting the CPU main frequency to the corresponding mode. At present, the main frequency of many chips can be set in different modes, corresponding to different sizes. For example, low mode corresponds to 32 kHz, normal mode corresponds to 80 kHz, and high mode corresponds to 120 KHz. Then different CPU main frequency modes are set according to the calculation results in step 4.

Step 6: after the ANC parameters are adjusted, restoring the CPU main frequency to the original mode.

In addition, an embodiment of the present application further provides a self-adaptive adjustment device of ANC parameter, and the self-adaptive adjustment device of ANC parameter includes: a memory, a processor, and a self-adaptive adjustment program for ANC parameters stored in the memory and executable on the processor, and when the self-adaptive adjustment program of ANC parameters is executed by the processor, the steps of the self-adaptive adjustment method of ANC parameter as described above are implemented.

Besides, an embodiment of the present application further provides a computer-readable storage medium, on which a self-adaptive adjustment program of ANC parameter is stored. When the self-adaptive adjustment program of ANC parameters is executed by a processor, the steps of the self-adaptive adjustment method of ANC parameter as described above are implemented.

It should be noted that, in this document, the terms "comprising", "comprises" or any other variations thereof are intended to cover a non-exclusive inclusion, such that a process, method, article or system that includes a series of elements not only includes those elements, it also includes other elements not expressly listed or inherent in the process, method, article or system. Without further limitation, an element defined by the statement "comprises a . . ." does not exclude the presence of additional identical elements in a process, method, article or system that includes that element.

The above serial numbers of the embodiments of the present application are only for description and do not represent the advantages and disadvantages of the embodiments.

Through the above description of the embodiments, those skilled in the art can clearly understand that the methods of the above embodiments can be implemented by means of software plus the necessary general hardware platform. Of course, it can also be implemented by hardware, but in many cases the former is better implementation. Based on this understanding, the technical solution of the present application can be embodied in the form of a software product in essence or the part that contributes to the existing technology. The computer software product is stored in a storage medium (such as read-only memory (ROM)/RAM, disk, compact disc (CD)), including several instructions to cause a terminal device (which can be a mobile phone, computer, server, air conditioner, or network device, etc.) to execute the methods described in various embodiments of the present application.

The above are only some embodiments of the present application, and do not limit the scope of the present application thereto. Under the inventive concept of the present application, equivalent structural transformations made according to the description and drawings of the present application, or direct/indirect application in other related technical fields are included in the scope of the present application.

What is claimed is:

1. A self-adaptive adjustment method of active noise cancellation (ANC) parameter, comprising:

obtaining frequency points of noise reduction headphone with energy loss and energy loss values of each frequency point, and determining a quantity of the frequency points with the energy loss values are greater than a first energy loss threshold;

determining whether a sum of the energy loss values is greater than a second energy loss threshold, and determining whether the quantity of frequency points is greater than a preset frequency point quantity threshold;

in response to that the sum of the energy loss values is greater than a second energy loss threshold and the quantity of frequency points is greater than the preset frequency point quantity threshold, calculating a main frequency of a chip of the noise reduction headphone and adjusting the chip to a target main frequency mode corresponding to the main frequency; and calculating and adjusting the ANC parameter of the noise reduction headphone in the target main frequency mode.

2. The self-adaptive adjustment method of ANC parameter according to claim 1, wherein the noise reduction headphone comprises at least: a speaker, a feedback microphone and a feedforward microphone, and before the obtaining the frequency points of noise reduction headphone with energy loss and the energy loss values of the each frequency point, the method further comprises:

in response to detecting a fit of the noise reduction headphone, playing a test audio through the speaker and receiving the test audio by the feedback microphone to obtain a received audio.

3. The self-adaptive adjustment method of ANC parameter according to claim 2, wherein the obtaining the frequency points of noise reduction headphone with energy loss and the energy loss values of the each frequency point comprises:

calculating the frequency points of the noise reduction headphone with energy loss and the energy loss values of the each frequency point based on energy in the test audio and the received audio.

4. The self-adaptive adjustment method of ANC parameter according to claim 2, wherein after the determining whether the sum of the energy loss values is greater than the second energy loss threshold, and determining whether the quantity of frequency points is greater than the preset frequency point quantity threshold, the method further comprises:

in response to that the sum of the energy loss values is not greater than the second energy loss threshold, and the quantity of frequency points is not greater than the preset frequency point quantity threshold, adjusting a gain of the feedforward microphone.

5. The self-adaptive adjustment method of ANC parameter according to claim 1, wherein the calculating the main frequency of the chip of the noise reduction headphone comprises:

calculating the main frequency according to the quantity of frequency points and a preset theoretical processing time.

6. The self-adaptive adjustment method of ANC parameter according to claim 1, wherein the chip comprises a plurality of main frequency modes, and the adjusting the chip to the target main frequency mode corresponding to the main frequency comprises:

obtaining a main frequency range of each main frequency mode, determining the target main frequency mode according to the main frequency range in which the main frequency is located, and adjusting the chip to a corresponding target main frequency mode.

7. The self-adaptive adjustment method of ANC parameter according to claim 1, wherein after the calculating and adjusting the ANC parameter of the noise reduction headphone in the target main frequency mode, the method further comprises:

restoring the target main frequency mode to the main frequency mode of the chip before the ANC parameter is adjusted.

8. The self-adaptive adjustment method of ANC parameter according to claim 1, wherein before the obtaining the frequency points of noise reduction headphone with energy loss and the energy loss values of the each frequency point, the method further comprises:

calculating the first energy loss threshold, the preset frequency point quantity threshold, the second energy loss threshold and the preset theoretical processing time based on the current ANC parameters of the noise reduction headphone.

9. A self-adaptive adjustment device of active noise cancellation (ANC) parameter, comprising:

a memory;

a processor; and a self-adaptive adjustment program of ANC parameter stored in the memory and executable on the processor; wherein when the self-adaptive adjustment program of ANC parameter is executed by the processor, the self-adaptive adjustment method of ANC parameter according to claim 1 is implemented.

10. A non-transitory computer-readable storage medium, wherein a self-adaptive adjustment program of active noise cancellation (ANC) parameter is stored on the non-transitory computer-readable storage medium, and when the self-adaptive adjustment program of ANC parameter is executed by a processor, the self-adaptive adjustment method of ANC parameter according to claim 1 is implemented.

\* \* \* \* \*